(12) United States Patent
Cha

(10) Patent No.: US 6,815,305 B2
(45) Date of Patent: Nov. 9, 2004

(54) METHOD FOR FABRICATING BICMOS SEMICONDUCTOR DEVICES

(75) Inventor: Jae Han Cha, Chungchongbuk-do (KR)

(73) Assignee: Hynix Semiconductor Inc., Ichon-shi (KR)

(*) Notice: Subject to any disclaimer, the term of this patent is extended or adjusted under 35 U.S.C. 154(b) by 138 days.

(21) Appl. No.: 10/318,158

(22) Filed: Dec. 13, 2002

(65) Prior Publication Data

US 2004/0058503 A1 Mar. 25, 2004

(30) Foreign Application Priority Data

Sep. 24, 2002 (KR) ................................ 10-2002-0057804

(51) Int. Cl.[7] .............................................. H01L 21/331
(52) U.S. Cl. ..................................... 438/360; 438/326
(58) Field of Search ............................... 438/322–324, 438/326, 341, 350, 353, 359, 360, 361, 427, 429, 433, 524

(56) References Cited

PUBLICATIONS

D.L. Harame, et al. "Si/SiGe Epitaxial–Base Transistors–Part II: Process Integration and Analog Applications." *IEEE Transactions On Electron Devices*, vol. 42, No. 3, Mar. 1995, pp. 469–482.

David L. Harame, et al. "Current Status and Future Trends of SiGe BiCMOS Technology," *IEEE Transactions on Electron Devices*, vol. 48, No. 11, Nov. 2001, pp. 2575–2584.

*Primary Examiner*—Richard Elms
*Assistant Examiner*—Beth E. Owens
(74) *Attorney, Agent, or Firm*—Piper Rudnick LLP

(57) ABSTRACT

A method for fabricating a semiconductor device is described in which isolation layers and a collector of a BJT are simultaneously formed by an epitaxtial growth process during a process of fabricating a BiCMOS. The method for fabricating a semiconductor device of the present invention includes processes of forming a first mask layer on a semiconductor substrate, etching a predetermined portion of the semiconductor substrate with predetermined depth using the first mask layer, forming a first isolation layer on a side face of the etched semiconductor substrate, forming a first epitaxial layer doped with a plurality of layers by epitaxial growth of the exposed portion of the semiconductor substrate, forming a second mask layer on the first epitaxial layer, and forming a second epitaxial layer by epitaxial growth of a portion of the first epitaxial layer.

14 Claims, 5 Drawing Sheets

METHOD FOR FABRICATING BICMOS SEMICONDUCTOR DEVICES

This application claims the benefit of the Korean Application No. P2002-57804 filed on Sep. 24, 2002, which is hereby incorporated by reference.

BACKGROUND OF THE INVENTION

1. Field of the Invention

The present invention relates to a method for fabricating a semiconductor device, and more particularly, to a method for fabricating a semiconductor device in which isolation layers and a bipolar junction transistor collector are simultaneously formed by an epitaxial growth process during a process of fabricating a BiCOMS.

2. Discussion of the Related Art

Generally, circuits of a semiconductor device are formed based on a complementary metal oxide semiconductor CMOS transistor. Because of a limited capability of the CMOS transistor to drive a current, however, a BiCOMS circuit is being used for a semiconductor device of superhigh speed, in which a bipolar junction transistor BJT is used along with the CMOS transistor to be applied to some circuits in need of high current driving capability.

At this instance, to apply both of the BJT and the CMOS transistor to one semiconductor chip, additional processes such as an epitaxial growth process and photo mask and photo etching processes should be performed during a CMOS transistor fabricating process. These additional processes can increase a production cost while reducing the yield rate.

A process of fabricating a related art BiCOMS will be described with reference to accompanying drawings.

FIGS. 1A and 1D are plane views illustrating a process of fabricating a related art BiCMOS.

When the BiCMOS process is performed in which a BJT and a CMOS logic circuit are formed on the same substrate, a deep trench isolation DTI process and a shallow trench isolation STI process should also be performed. The DTI process is for reducing latch-up immunity of a BJT and a substrate parasitic capacitance and the STI process is for insulating the CMOS.

A process of forming an isolation film during the related art BiCMOS fabricating process is as follows.

First, as shown in FIG. 1A, on a semiconductor substrate 1, first and second insulating layers 2 and 3 are formed in order so as to prevent the growth of silicon. At this time, the first insulating layer 2 is an oxidation film and the second insulating layer 3 is a nitride hard mask.

Then, the second insulating layer 3 is selectively etched by a photolithography process, thereby defining a DTI region, the region for reducing latch-up immunity of the BJT and a substrate parasitic capacitance.

Subsequently, a predetermined portion of the first insulating layer 2 is etched with predetermined depth using the second insulating layer 3, being selectively patterned, as a mask. In this way, a trench for forming the DTI region is formed.

Subsequently, as shown in FIG. 1B, the DTI region 4 is formed by filling up the trench with an insulating material and etching it back. At this instance, the nitride hard mask, i.e., the second insulating layer 3a, becomes thinner during the etch-back process.

Then, as shown in FIG. 1C, as a photo-mask process for an STI process, a photoresist (not shown) is applied to the entire surface of the substrate and a photoresist pattern is formed to define the STI region. And, the first and second insulating layers 2 and 3 being exposed are selectively etched. At this time, a nitride hard mask, i.e., the second insulating layer 3b, maintains the same thickness without being thinner during the etching process.

A trench 5 for forming the STI region is formed by selectively etching the exposed semiconductor substrate 1 using the first and second insulating layers 2 and 3, being patterned, as a mask.

Then, as shown in FIG. 1D, the STI region 6 is formed by filling up the trench 5 with an insulating material and etching it back. At this time, a nitride hard mask, i.e., the second insulating layer 3c, maintains the same thickness without being thinned during the etching process.

As described above, generally, in the process of forming a device isolating film during the related art BiCMOS fabricating process, the trench of the etched semiconductor substrate is filled with the insulating film and then is evened.

A process of fabricating a BiCMOS according to the related art, however, has the following problems or disadvantages.

First, in the process of fabricating the BiCMOS of the related art, an additional photo mask process for forming a STI region should be performed after a DTI region is formed. Also, after the STI region being formed, another process for reducing a resistance of a collector should be performed to improve the high frequency characteristic of BJT. Finally, a process of implanting an ion of high energy and high degree of density should also be separately performed from a process of forming a well of the CMOS. Hence, the overall process steps increase.

SUMMARY OF THE INVENTION

Accordingly, the present invention is directed to a method for fabricating a semiconductor device that substantially obviates one or more problems due to limitations and disadvantages of the related art.

An object of the present invention is to provide a method for fabricating a semiconductor device in which isolation films and a collector of a BJT are simultaneously formed by an epitaxtial growth process during a process of fabricating a BiCMOS.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for fabricating a semiconductor device of the present invention includes processes of forming a first mask layer on a semiconductor substrate, etching a predetermined portion of the semiconductor substrate with predetermined depth using the first mask layer, forming a first isolation layer on a side face of the etched semiconductor substrate, forming a first epitaxial layer doped with a plurality of layers by epitaxial growth of the exposed portion of the semiconductor substrate, forming a second mask layer on the first epitaxial layer, and forming a second epitaxial layer by epitaxial growth of a portion of the first epitaxial layer.

The first mask layer has a laminated structure of an oxidation film and a nitration film for the use of a hard mask. A portion of the semiconductor substrate, the portion being etched by the first mask layer, includes first and second isolation layers having different depth from each other.

The first epitaxial layer is a collector of the BJT and the second epitaxial layer is a well region of a CMOS.

The first epitaxial layer having a height lower than the first isolation layer is formed by simultaneously performing two processes: a process of implanting ion impurities in the first epitaxial layer, and a process of epitaxial growth. The first epitaxial layer has either a two-layered structure of a doped epitaxial layer and an undoped epitaxial layer or a three-layered structure of an undoped epitaxial layer, a doped epitaxial layer, and an undoped epitaxial layer.

The second mask layer is formed of an oxidation layer for a hard mask and acts as a second isolation layer being formed inside the second epitaxial layer. Also, the second mask layer has the same thickness as that of the second epitaxial layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

FIGS. 2A to 2G are plane views illustrating processes of fabricating a BiCMOS in accordance with the present invention.

In a method for fabricating a semiconductor device in accordance with the present invention, isolation films and a collector of a BJT are simultaneously formed by forming a silicon epitaxial layer being strongly doped on a sub-collector region of the BJT and by forming an undoped, pure silicon epitaxial layer on the well region during DTI and STI processes.

A process of multi depth trench isolation MDTI according to the present invention will be described in detail below.

Figure 1A:
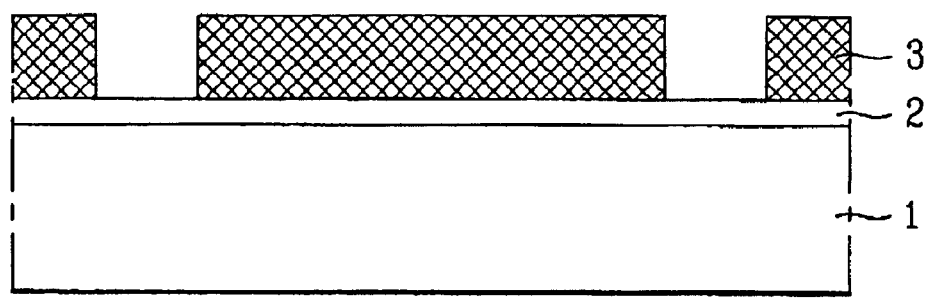
FIGS. 1A to 1D are plane views illustrating processes of fabricating a BiCMOS according to the related art.
Figure 1B:
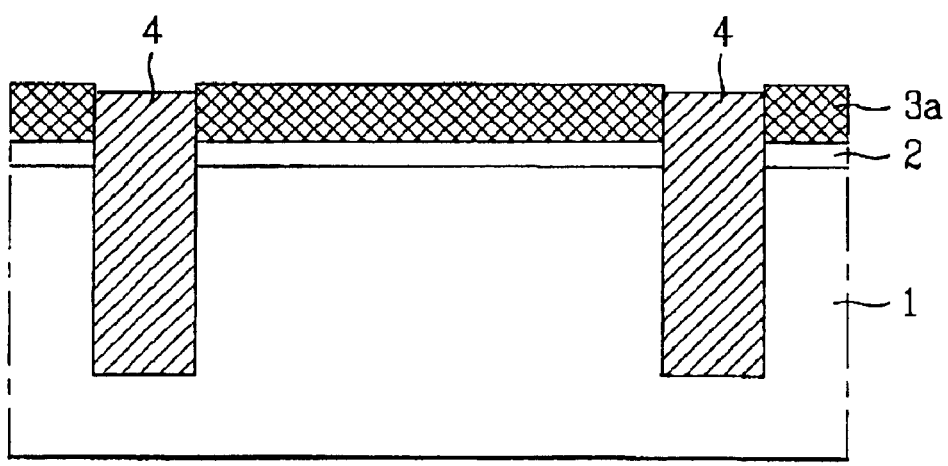
Figure 1C:
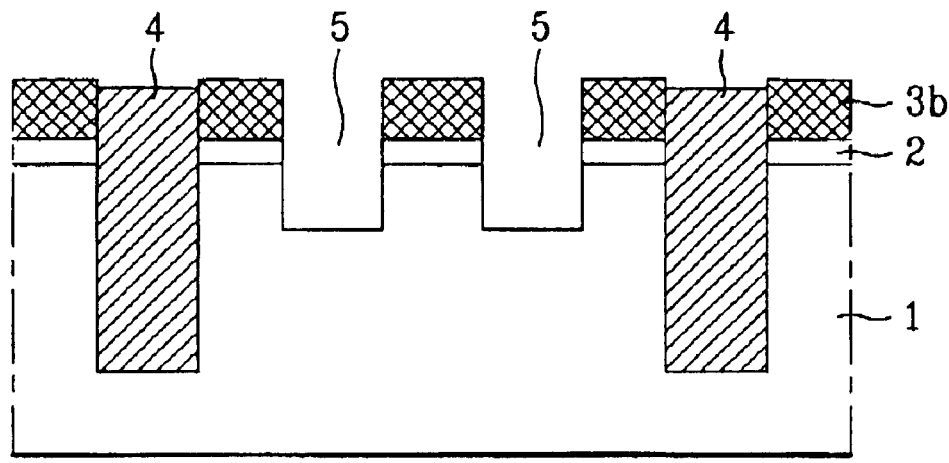
Figure 1D:
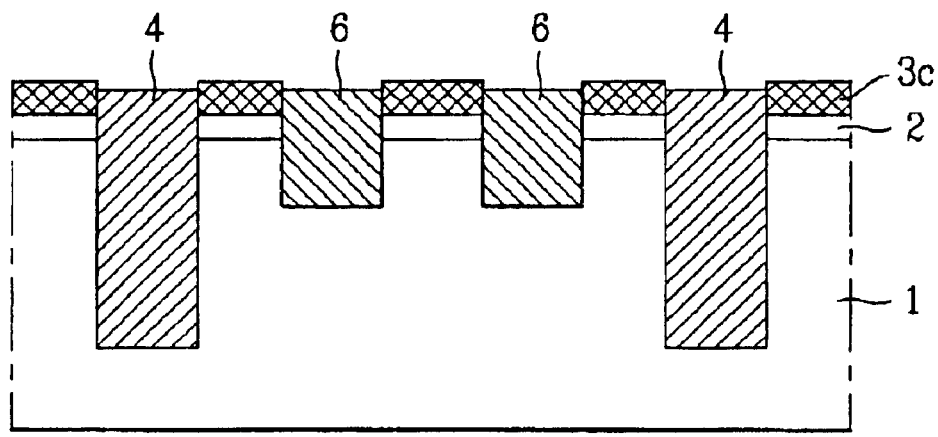
Figure 2A:
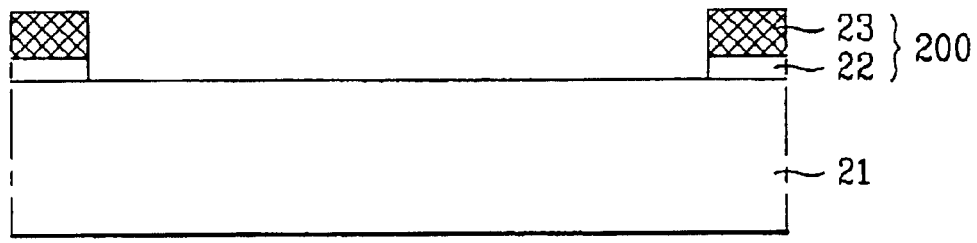
FIGS. 2A to 2G are plane views illustrating processes of fabricating a BiCMOS according to the present invention.

First, as shown in FIG. 2A, an oxidation film 22 and a nitration film 23 are deposited on a semiconductor substrate 21 in order. And, a first mask layer 200, acting as a first epitaxial growth preventing layer, is formed by selectively etching the oxidation film 22 and the nitration film 23 through a photolithography process.

Figure 2B:
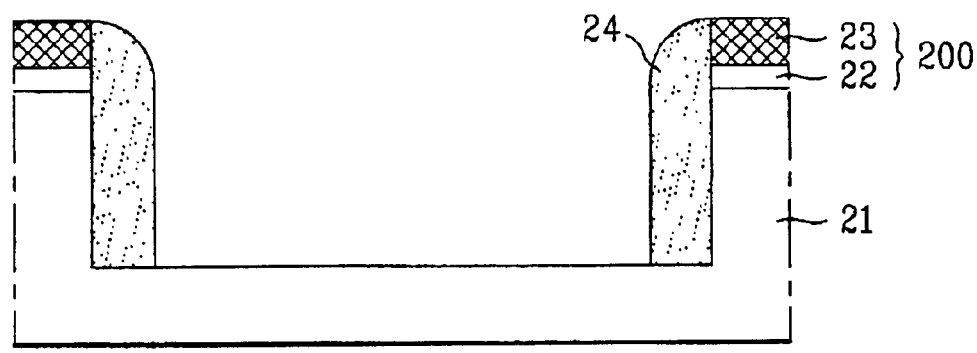

Then, as shown in FIG. 2B, the semiconductor substrate 21 being exposed is etched with predetermined depth using the first mask layer 200. The portion of the semiconductor substrate 21 being etched includes a first isolation region (DTI region) and a second isolation region (STI region). At this instance, the semiconductor substrate 21 should be etched with enough depth so that the DTI region can be formed.

A DTI insulating material layer is formed on the entire surface of the etched semiconductor substrate 21 and a DTI layer 24 is formed on a side face of the etched semiconductor substrate 21 through an etch-back process. The DTI insulating material layer is formed of an oxidation film.

Figure 2C:
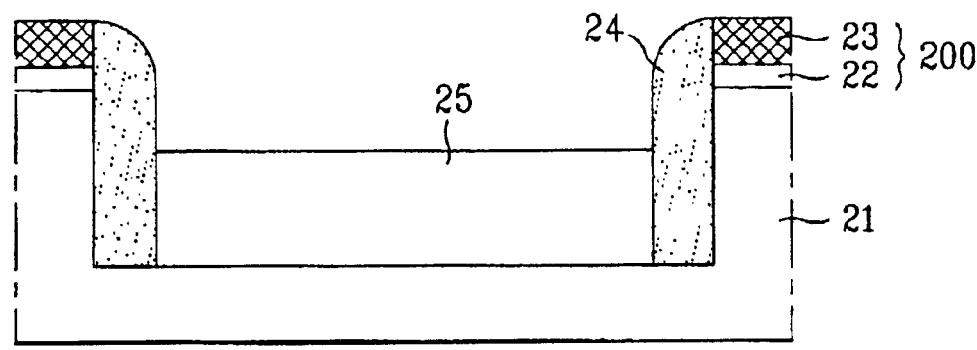

Subsequently, as shown in FIG. 2C, a first epitaxial layer 25 for forming a collector of the BJT is formed on the exposed semiconductor substrate 21 through a selective epitaxial growth process.

The first epitaxial layer 25 has a multiple-layered structure with doping as two processes, a process of implanting impurity ions such as B, P, and As and a process of epitaxial growth, are simultaneously performed.

The multi-layered structure is either a two-layered structure of a doped epitaxial layer and an undoped epitaxial layer or a three-layered structure of an undoped epitaxial layer, a doped epitaxial layer, and an undoped epitaxial layer.

Figure 2D:
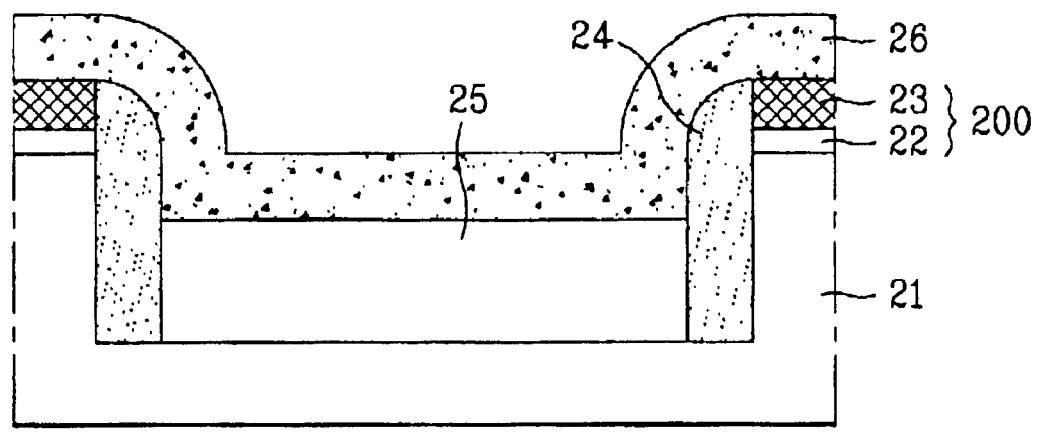

Then, as shown in FIG. 2D, an oxidation film 26 for a hard mask is deposited on the entire surface of the substrate. The oxidation film 26 for the hard mask is used to form the STI layer and serves as a hard mask during the epitaxial growth process. The thickness of the oxidation film 26 is decided in consideration of the thickness of the epitaxial growth layer and the thickness of the STI layer in the following epitaxial growth process.

Figure 2E:
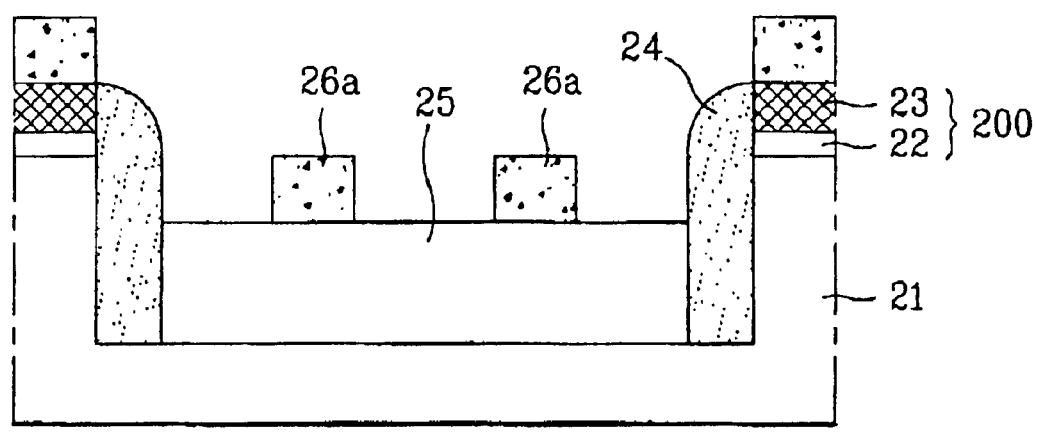

As shown in FIG. 2E, the oxidation film 26 for the hard mask is selectively etched to define the STI region and a second mask layer 26a is formed to act as a second epitaxial growth preventing layer.

Figure 2F:
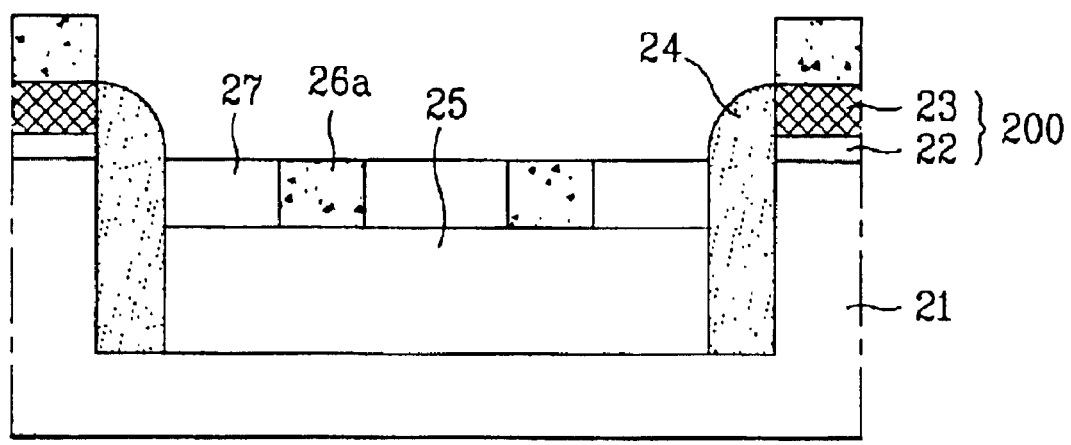

Then, as shown in FIG. 2F, a second epitaxial layer 27 is formed using the second mask layer 26a as the mask. At this instance, the second epitaxial layer 27 is formed of pure silicon which is not doped with impurities.

Figure 2G:
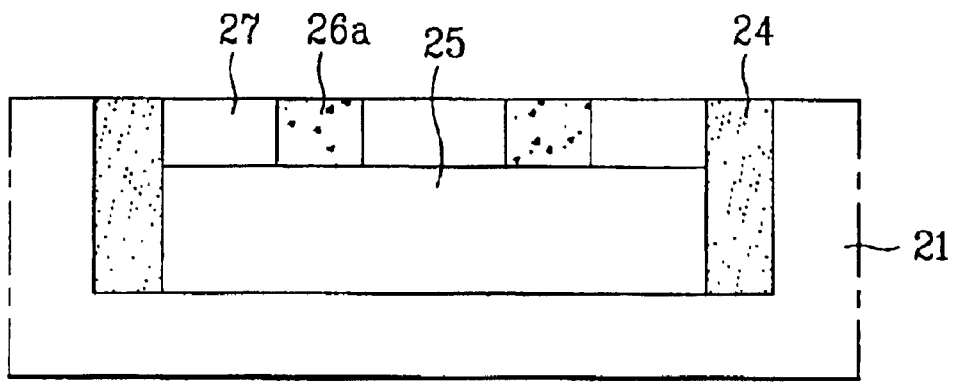

Finally, as shown in FIG. 2G, the second epitaxial layer 27 and the second mask layer 26a are evened by an etch-back process or a chemical mechanical polishing CMP process. The second mask layer 26a after being evened becomes the STI layer acting as an isolation film of the CMOS.

As described above, in the present invention, a Si layer is formed on a collector region of the BJT by a doped self-aligned epitaxial growth SEG method after the etch-back process for forming the DTI region. Therefore, a process of implanting an ion of high energy and high-density can be omitted.

The technique to simultaneously form the collector region (first epitaxial layer) of the BJT and isolation films (DTI layer and STI layer) by simultaneously performing the processes of the epitaxial growth and ion doping does not limited to the process of fabricating the BiCMOS, but can also be applied to a process of fabricating other semiconductor devices such as Si Mono-junction of the CMOS, SiGe HBT, SiGe JFET, and modulation-doped-field-effect-transistor MODFET.

A method for fabricating a semiconductor device of the present invention has the following advantages.

First, in a method for fabricating a semiconductor device of the present invention, a photo mask process and a process of forming a doped epitaxial layer are simultaneously performed during a process of forming DTI and STI layers of a BiCMOS device, thereby reducing the overall process steps and saving a production cost.

Also, a BJT with more stable performance is obtained as the possibility of the fabricating process being failed decreases thanks to reduced fabricating process steps.

Finally, in a method for fabricating a semiconductor device of the present invention, a junction leakage problem of the device is remarkably improved and BJT can perform various functions with preciseness by a SEG process. Accordingly, the time for developing a new semiconductor device is likely to be reduced.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method for fabricating a semiconductor device, comprising processes of:

forming a first mask layer on a semiconductor substrate;

etching a predetermined portion of the semiconductor substrate with predetermined depth using the first mask layer;

forming a first isolation layer on a side of the etched semiconductor substrate;

forming a first epitaxial layer doped with a plurality of layers by epitaxial growth of the exposed portion of the semiconductor substrate;

forming a second mask layer on the first epitaxial layer; and forming a second epitaxial layer by epitaxial growth of a portion of the first epitaxial layer.

2. The method of claim 1, wherein a portion of the semiconductor substrate, the portion being etched by the first mask layer, includes first and second isolation layers having different depths from each other.

3. The method of claim 1, wherein the first epitaxial layer is a collector of a BJT.

4. The method of claim 1, wherein the second epitaxial layer is a well region of a CMOS.

5. The method of claim 1, wherein the second epitaxial layer is formed of undoped pure silicon.

6. The method of claim 1, wherein the second mask layer acts as the second isolation layer being formed inside the second epitaxial layer.

7. The method of claim 1, wherein the second mask layer has the same thickness as that of the second epitaxial layer.

8. The method of claim 1, wherein the first epitaxial layer has a height lower than the first isolation layer.

9. The method of claim 1, wherein the first epitaxial layer is formed by simultaneously performing two processes: a process of implanting ion impurities in the first epitaxial layer and a process of epitaxial growth.

10. The method of claim 1, wherein the first epitaxial layer has either a two-layered structure of a doped epitaxial layer and an undoped epitaxial layer or a three-layered structure of an undoped epitaxial layer, a doped epitaxial layer, and an undoped epitaxial layer.

11. The method of claim 1, wherein the first mask layer has a laminated structure of an oxidation film and a nitration film for the use of a hard mask.

12. The method of claim 1, wherein the second mask layer is formed as an oxidation film for use of a hard mask.

13. The method of claim 1, wherein the method for fabricating a semiconductor device further comprises a process of evening the second epitaxial layer after forming it.

14. The method of claim 13, wherein the process of evening the second epitaxial layer is performed by an etch-back process or a CMP process.

* * * * *